(12) United States Patent  (10) Patent No.: US 9,281,313 B2
Herberholz  (45) Date of Patent: Mar. 8, 2016

(54) SINGLE POLY NON-VOLATILE MEMORY CELLS

(75) Inventor: Rainer Herberholz, Cambridge (GB)

(73) Assignee: Qualcomm Technologies International, Ltd., Cambridge (GB)

(*) Notice: Subject to any disclaimer, the term of this patent is extended or adjusted under 35 U.S.C. 154(b) by 0 days.

(21) Appl. No.: 13/449,822

(22) Filed: Apr. 18, 2012

(65) Prior Publication Data

US 2013/0015514 A1 Jan. 17, 2013

(30) Foreign Application Priority Data

Jul. 12, 2011 (GB) .................................. 1111916.1

(51) Int. Cl.
H01L 27/115 (2006.01)

(52) U.S. Cl.
CPC ................................ H01L 27/11558 (2013.01)

(58) Field of Classification Search
CPC .................. H01L 27/11558; H01L 27/11521; H01L 27/11519; H01L 27/115; H01L 29/42324; H01L 29/7883; G11C 16/0441; G11C 2216/10
USPC .......... 257/317, 318, 321, 322, 314, E21.694, 257/E27.103, E29.304, E21.682, E29.129, 257/E29.303
See application file for complete search history.

(56) References Cited

U.S. PATENT DOCUMENTS

| 7,671,401 | B2 | 3/2010 | Fang et al. | |
| 2007/0152262 | A1 | 7/2007 | Han | |
| 2008/0006868 | A1 | 1/2008 | Hsu et al. | |
| 2008/0153230 | A1* | 6/2008 | Jeong | 438/261 |
| 2009/0122604 | A1 | 5/2009 | Liu et al. | |
| 2009/0203182 | A1* | 8/2009 | Lee et al. | 438/305 |
| 2010/0157669 | A1 | 6/2010 | Audzeyeu et al. | |
| 2010/0302854 | A1* | 12/2010 | Wu et al. | 365/185.18 |

OTHER PUBLICATIONS

Okazaki et al., "Sub-1/4-μm Dual-Gate CMOS Technology Using In-Situ Doped Polysilicon for nMOS and pMOS Gates", IEEE Trans. Electron Dev., vol. 42, pp. 1583-1590, 1995.*
European Search Report from corresponding European application EP12164564, dated Nov. 12, 2012.
Rosenberg, Joel: "Embedded Flash on Standard CMOS Logic Enables Security for Deep Submicron Designs"; Virage Logic s.l.; Government Microcircuit Applications Critical Technology Conference, Mar. 17, 2009, pp. 1-19.
Examination Report issued for European Patent Application No. 12 164 564.2, dated Jul. 28, 2014, 6 pages.

* cited by examiner

Primary Examiner — Marvin Payen
Assistant Examiner — Victor Barzykin
(74) Attorney, Agent, or Firm — Procopio, Cory, Hargreaves & Savitch LLP

(57) ABSTRACT

A non-volatile memory cell that includes a semiconductor substrate; a coupling capacitor located in a first active region of the semiconductor substrate; and at a shared second active region of the semiconductor substrate, a sense transistor and a tunnelling capacitor configured in parallel with the gate of the sense transistor. The coupling capacitor, sense transistor and tunnelling capacitor share a common floating gate electrode and the sense transistor includes source and drain regions arranged such that the tunnelling capacitor is defined by an overlap between the floating gate electrode and the drain region of the sense transistor. Word-line contacts may be to a separate active area from the coupling capacitor. This and/or other features can help to reduce Frenkel-Poole conduction.

22 Claims, 4 Drawing Sheets

SINGLE POLY NON-VOLATILE MEMORY CELLS

BACKGROUND OF THE INVENTION

This invention relates to a memory cell configuration for non-volatile memory arrays.

Fabrication of high density non-volatile memory cells with a stacked floating gate arrangement requires additional processing steps as compared to the fabrication of standard logic CMOS devices. As a result, the fabrication process for non-volatile memory cells typically lags behind the leading process technology available for the fabrication of logic CMOS devices. For example, the leading logic CMOS process in 2010 has been at the 28 nm process level, whereas the most advanced process technology for high-density non-volatile memory embedded in CMOS has been based on a 90 nm process.

It is possible to fabricate low density non-volatile memory arrays using standard CMOS processes without any additional process steps by abandoning the stacked gate arrangement. This can be achieved by, for example, attaching a coupling capacitor, sensing transistor and tunnelling capacitor to different active regions defined in a semiconductor substrate beneath a common floating gate electrode. Such a cell structure is described in U.S. Pat. No. 7,671,401 and is illustrated in FIG. 1. In FIG. 1, 23 represents a programming transistor, 21 represents an access transistor and 22 represents a control capacitor.

However, such low density non-volatile memory cells have the disadvantage that the area consumed by each memory cell is large as compared with more conventional high-density non-volatile memory cells. This is a result of having to ensure that the active regions of the memory cell are sufficiently well-spaced in the substrate to avoid interaction between the component parts of the cell. This is true even for non-volatile memories having a common floating gate electrode that make use of more advanced process technology. For example, non-volatile memory having a common floating gate electrode (NOVeA) is available from Synopsys that is fabricated using 65 nm process technology, but estimates indicate that these devices still require an area of around 40 um² per bit. See Rosenberg, John; "Embedded Flash on Standard CMOS Logic Enables Security for Deep Submicron Designs"; Virage Logic s.l.; Government Microcircuit Applications Critical Technology Conference, 2009.

Furthermore, the general pursuit of non-volatile memory cells using deep submicron CMOS technologies with no added process steps is hampered by charge loss from the floating electrode by Frenkel-Poole conduction. Such charge loss is caused by the use of non-stoichiometric dielectric layers over the gate stack in order to provide etch-stop layers and control the mechanical stress so as to enhance the mobility of the CMOS channel. The charge loss is exacerbated when the gate stack height and spacer width is reduced. Moving to a low density memory cell structure increases the likelihood of charge loss by Frenkel-Poole conduction due to the large relative perimeter of the separate coupling capacitor.

There is therefore a desire for higher-density non-volatile memory cells that can be entirely fabricated using standard CMOS processing steps. This would allow non-volatile memory cells to access leading CMOS process technologies and hence leverage the benefits of smaller size, higher speed and lower power consumption provided by improved process technology. Additionally, there is a need to address the charge loss in nanoscale non-volatile memory cells due to Frenkel-Poole conduction.

SUMMARY OF THE INVENTION

According to a first aspect of the present invention there is provided a non-volatile memory cell comprising: a semiconductor substrate; a coupling capacitor located in a first active region of the semiconductor substrate; and at a shared second active region of the semiconductor substrate, a sense transistor and a tunnelling capacitor configured in parallel with the gate of the sense transistor; wherein the coupling capacitor, sense transistor and tunnelling capacitor share a common floating gate electrode and the sense transistor includes source and drain regions arranged such that the tunnelling capacitor is defined by an overlap between the floating gate electrode and the source region of the sense transistor.

The non-volatile memory cell preferably further comprises a gate dielectric layer located between the floating gate electrode and the semiconductor substrate.

Preferably the coupling capacitor is defined by an overlap between the floating gate electrode and a first doped well of the first active region, the coupling capacitor being bordered on all sides by shallow trench isolation.

The non-volatile memory cell preferably further comprises a third active region of the semiconductor substrate supporting contacts for a word line, the third active region being located in the first doped well of the first active region but, down to a first depth in the semiconductor substrate, separated from the first active region by shallow trench isolation, wherein the first depth is less than the depth of the first doped well of the first active region and the third active region is electrically connected to the coupling capacitor through that part of the first doped well of the first active region that extends below the first depth.

Preferably the source region of the sense transistor is a second doped well of the shared second active region and the area of the second doped well in the plane of the cell is substantially larger than the area of overlap between the floating gate electrode and the second doped well. Preferably the drain region of the sense transistor is a lightly-doped drain region.

Preferably the drain of the sense transistor is coupled to contacts for a bit line and the source of the sense transistor is coupled to contacts for a source line.

The non-volatile memory cell preferably further comprises a control transistor defined in a fourth active region of the semiconductor substrate, the control transistor being arranged in series with the sense transistor between the contacts for a bit line and the sense transistor, wherein the gate of the control transistor is electrically isolated from the common floating gate electrode.

Preferably, through manipulation of the voltage at the gate of the control transistor, the control transistor is operable to isolate the sense transistor from the contacts for a bit line.

Suitably the semiconductor substrate is a p-type substrate and the floating gate electrode is an n-type doped conductor. Suitably, the first doped well is an n-type well. Suitably, the second doped well is an n-type well. Suitably the sense transistor is an n-channel device and the tunnelling capacitor is an n-type MOS capacitor.

Preferably the capacitance of the coupling capacitor is substantially larger than the total capacitance of the tunnelling capacitor and the gate capacitance of the sense transistor. Preferably the capacitance of the coupling capacitor is 10 or more times larger than the total capacitance of the tunnelling capacitor and the gate capacitance of the sense transistor.

Preferably the floating gate electrode is polysilicon. Preferably the floating gate electrode is substantially covered by an etch-stop layer. Preferably the cell comprises a protective layer between the floating gate and an etch stop layer for inhibiting conduction between the floating gate and the etch stop layer. Preferably the protective layer is a silicide-protect layer.

Preferably the cell is formed by a manufacturing process by which implantation of a first form is available for implanting wells and the concentration of dopant in the first and second doped wells is enhanced by means of implantation of that first form.

According to a second aspect of the present invention there is provided a non-volatile memory array comprising a plurality of non-volatile memory cells configured in accordance with the first aspect of the present invention, wherein each non-volatile memory cell is uniquely addressable by means of a grid of word and bit lines.

According to a third aspect of the present invention there is provided a non-volatile memory cell comprising, on a semiconductor substrate, a coupling capacitor, a sense transistor and a tunnelling capacitor configured in parallel with the gate of the sense transistor, and the coupling capacitor, sense transistor and tunnelling capacitor sharing a common floating gate electrode; wherein the coupling capacitor comprises a thin oxide region which is surrounded in the plane of the substrate by shallow trench isolation.

DESCRIPTION OF THE DRAWINGS

The present invention will now be described by way of example with reference to the accompanying drawings, in which.

DETAILED DESCRIPTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The present invention relates to non-volatile memory cells and, in particular, to compact non-volatile memory cells having a single common floating gate electrode. Such memory cells can be provided as an array of memory cells embedded in a logic integrated circuit or a dedicated non-volatile memory module. The non-volatile memory cells described herein are not limited to being fabricated from particular materials or in accordance with any particular process technology. Furthermore, it will be apparent to a person of skill in the art that the type of doped semiconducting regions of memory cells configured in accordance with the present invention can be switched for the opposite type (i.e. n-type regions could instead be p-type regions and vice versa) and the examples described herein are merely illustrative of one possible arrangement of doped semiconducting regions for a memory cell configured in accordance with the present invention.

Figure 1:
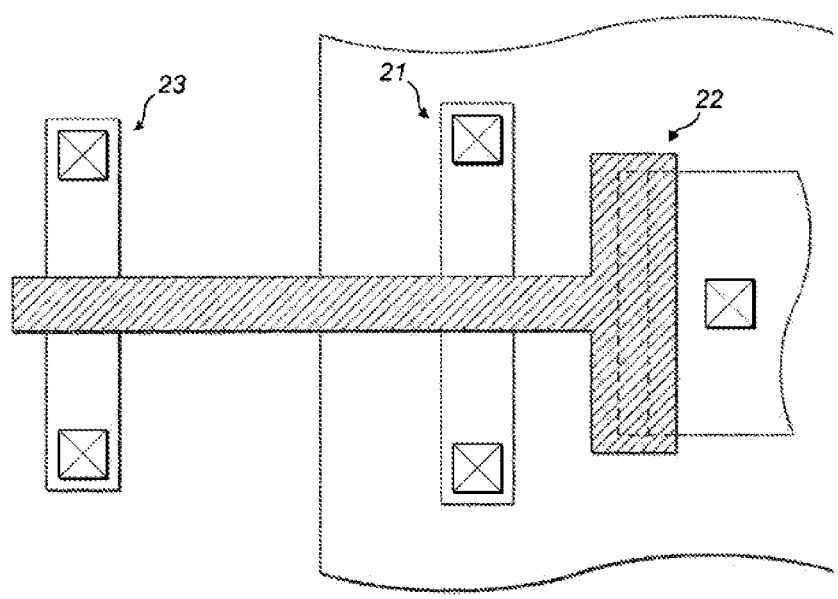
FIG. 1 is a drawing of one prior art design of memory cell.
Figure 2A:
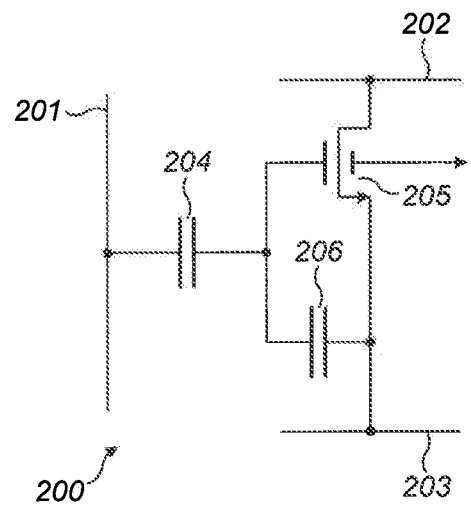
FIG. 2(a) is a schematic drawing of a non-volatile memory cell configured in accordance with the present invention.

FIG. 2 illustrates a non-volatile memory cell configured in accordance with the present invention. FIG. 2(a) is a schematic diagram illustrating an arrangement of the non-volatile memory cell between word 201, bit 202 and source 203 lines by means of which the cell can be addressed in a memory array. The memory cell comprises a coupling capacitor 204, sense transistor 205 and tunnelling capacitor 206. The tunnelling capacitor is arranged in parallel with the gate of the sense transistor, with the sense transistor extending between the bit and source lines. Note that in the representation in FIG. 2(a) the tunnelling capacitor 206 and sense transistor 205 shown in the figure could be swapped such that the capacitor 206 is adjacent to the bit line.

Figure 2B:
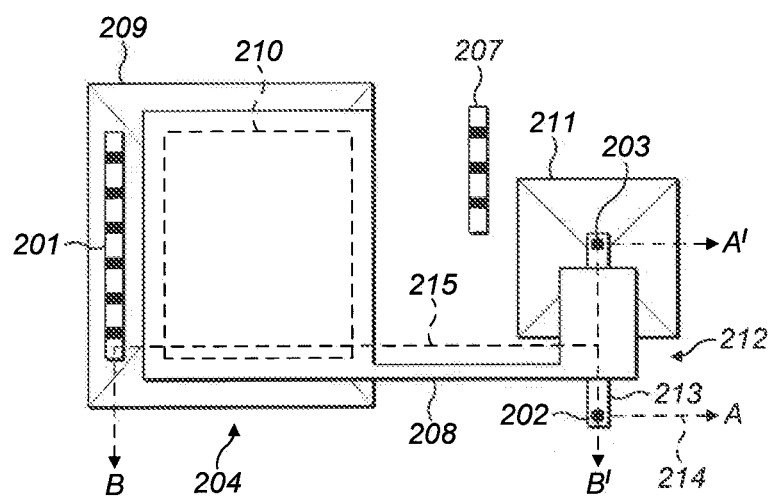
FIG. 2(b) is an exemplary cell layout of the non-volatile memory cell depicted in FIG. 2(a).

An exemplary layout of the non-volatile memory cell of FIG. 2(a) on a p-type substrate is shown in FIG. 2(b). The word line is represented by a set of contacts 201 which connect into an n-type region, the coupling capacitor NWell 209 that forms the bottom plate of coupling capacitor 204. It is significant that the active area of the contacts 201 and the back-plate of the coupling capacitor 204 are separated by a region that provides isolation between the contacts and the capacitor. That region could, as in this example, be an STI (shallow trench isolation) region. The use of an isolation region in this way is advantageous for lengthening the Frenkel-Poole conduction path. The top plate of the coupling capacitor is formed by a floating gate electrode 208 that extends over and connects in accordance with FIG. 2(a) the coupling capacitor 204, tunnelling capacitor 206 and sense transistor 205. Typically the floating gate electrode is polysilicon, but it could be any doped semiconductor, metal, or other conductor. The dielectric (typically silicon dioxide) of coupling capacitor 204 that separates the floating gate electrode from the NWell is indicated by area 210.

In accordance with the teaching of the present invention, tunnelling capacitor 206 and sense transistor 205 are combined into a single active region 212 between source line contact 205 and bit line contact 202. Floating gate electrode 208 forms the floating gate of sense transistor 205 and the top plate of capacitor 206, as will become clear from FIG. 3. The floating gate electrode is separated from the NWell by a layer of dielectric 213 of the capacitor 204. The tunnelling capacitor is formed over an n-type region, the tunnelling capacitor NWell 211, which forms the bottom plate of the tunnelling capacitor. A well-tap 207 is provided to prevent turning on the parasitic lateral bipolar npn transistor formed between the NWell regions 209 and 211.

Figure 3:
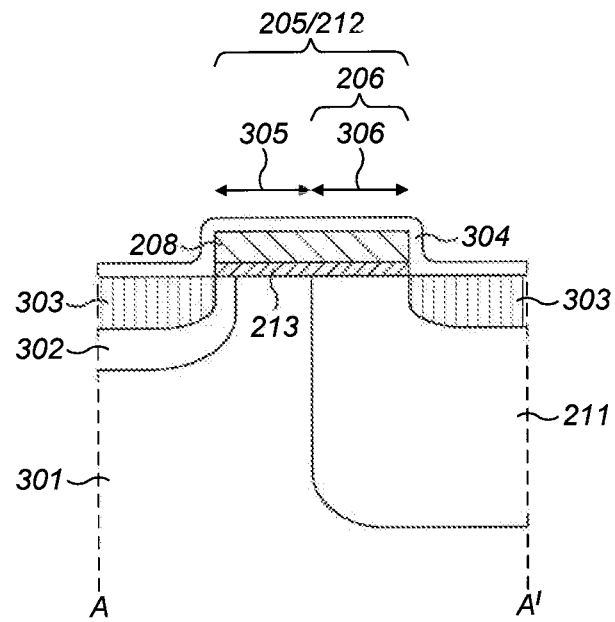
FIG. 3 is a cross-section of the combined sense transistor and tunnelling capacitor along section 214 between A and A' in FIG. 2(b).

FIG. 3 shows a cross section of the combined sense transistor and tunnelling capacitor along section 214 between A and A' in FIG. 2(b). Tunnelling capacitor 206 is formed in the active region of sense transistor 205 by the overlap between floating gate electrode 208 and NWell 211 defined in the p-type substrate 301. Typically, the tunnelling capacitor is an N+ polysilicon/NWell MOS type capacitor. The sense transistor is formed by the active region between NWell 211 and n-type doped region 302. Region 302 can be considered an NLDD (n-type lightly doped drain) region. The floating gate electrode is isolated from the NWell and the transistor channel by a layer of dielectric 213. Heavily doped n-type regions 303 are provided for connection to the bit and source line contacts (not shown). Preferably the floating gate electrode is covered by an etch-stop layer 304. This layer is useful as an etch stop, but it can have the disadvantages of leading to Frenkel-Poole charge loss. Such loss can be mitigated by reducing or minimising the length of the floating gate that runs over active semiconductor and/or by using a protective layer, for example, a dielectric layer used to prevent silicide formation in poly resistors or transistors used for ESD protection, as described in more detail below.

By merging the sense transistor and tunnelling capacitor into a single active region the size of the cell can be reduced. One explanation for this is that the capacitance of the coupling capacitor should advantageously be scaled linearly with the capacitance of the tunnelling and sense areas in order to cause the tunnelling area to be the main site through which the tunnelling voltage drops. For this reason the size of the call is largely dictated by the size of the coupling capacitor. In fact, it is advantageous if the width of the active area is at or close to the minimum dimension supported under the process technology, which is typically substantially less than the width of nominal I/O transistors fabricated by the process technology. For example, using a 40 nm process technology, a memory cell configured in accordance with the present invention can achieve a cell area of around 3.35 um$^2$, which is around 10 times smaller than current non-volatile memory cell designs based around a common floating gate. See Rosenberg, supra. At the 40 nm process node, the dimensions 305 and 306 in FIG. 3 can be of the order of 0.15 um to 0.3 um. Reducing the size of the cell reduces the length of the perimeter of the floating gate electrode over the active region and hence reduces the Poole-Frenkel charge loss across the etch-stop layer. Advantageously the width of the sense transistor's channel should be as small as can be satisfactorily formed using a given manufacturing process, since the width of that channel influences the size of the coupling capacitor and hence the overall size of the cell. Advantageously the length of the sense transistor's channel should be the minimum for which the transistor's threshold voltage can be adequately controlled.

Merging and minimising the tunnelling capacitor and sense transistor also has the advantage that the gate capacitance of the sense transistor can speed up write operations to the cell.

In order to ensure that the potential difference between the word line and source line, or the word line and bit line, occurs predominantly across the tunnelling capacitor 206, the capacitance of coupling capacitor 204 must be substantially larger than the total capacitance of the tunnelling capacitor 206 and the sense transistor 205.

The thickness of the dielectric layers 210 and 213 that form the plate dielectric of the coupling capacitor and the gate dielectric/plate dielectric of the tunnelling capacitor, respectively, are chosen to be sufficiently thin as to allow tunnelling currents to flow at voltages below the breakdown voltages of the p/n junctions involved, yet thick enough to maintain charge loss through the dielectric at an acceptable level so as to provide adequate data retention. Preferably the dielectric is a gate oxide appropriate for the I/O transistors of a dual-gate logic CMOS process. Some examples of materials for the dielectric include $SiO_2$, SiON and hi-k dielectrics such as $HfSiO_x$.

Figure 4:
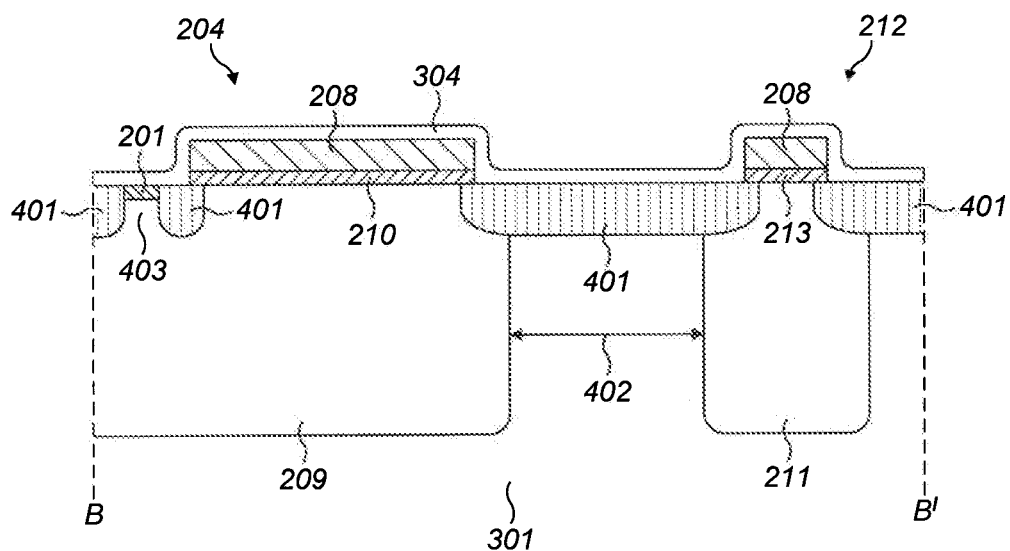
FIG. 4 is a cross-section of the memory cell along section 215 between B and B' in FIG. 2(b).

It is further advantageous if the coupling capacitor is configured as shown in FIG. 4, which is a cross section through the memory cell along section 215 between B and B' in FIG. 2(b). FIG. 4 shows coupling capacitor 204 and combined tunnelling capacitor and sense transistor 212, the two being separated by shallow trench isolation (STI) 401. STI 401 keeps the n-type wells 211 and 209 well-spaced in the p-type substrate by distance 402. This distance is selected so as to prevent excessive junction leakage and breakdowns during write or erase operations. Two limbs of the single floating gate electrode 208 are seen in cross section in the figure over dielectric layers 210 and 213. In this embodiment the floating gate electrode is covered by etch-stop layer 304, as previously discussed.

By arranging that the word line contacts connect into the coupling capacitor NWell 209 through a separate active region 403, the coupling capacitor can effectively be buried under the floating gate electrode and bordered on all sides by STI 401. The word line contacts to active region 403 are separated from the capacitor by STI, with connection being made between the word line contacts and the coupling capacitor through the NWell 209 (effectively, the back plate of the coupling capacitor). This significantly reduces Frenkel-Poole conduction by lengthening the leakage path and improves data retention of the cell.

Figure 5A:
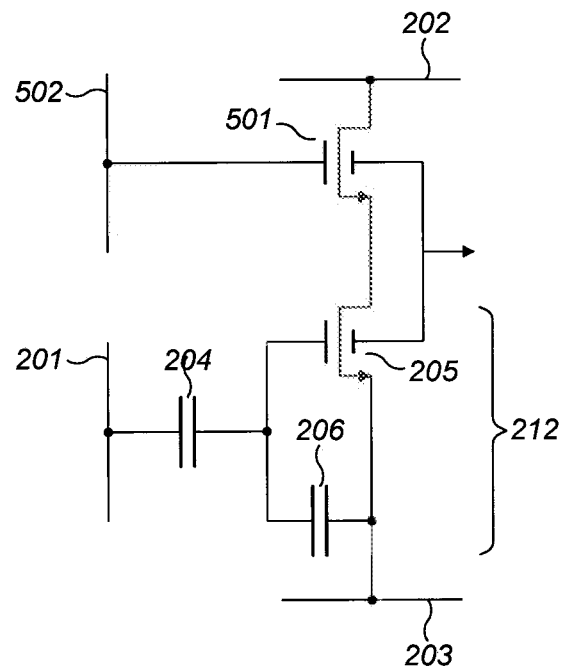
FIG. 5(a) is a schematic drawing of a non-volatile memory cell configured in accordance with a preferred embodiment of the present invention.

An alternative embodiment of the present invention is shown in FIG. 5, in which an additional control transistor 501 is provided in series with sense transistor 205. FIG. 5(a) is a schematic diagram illustrating an arrangement of the preferred non-volatile memory cell between word 201, bit 202 and source 203 lines by means of which the cell can be addressed in a memory array. The memory cell comprises a coupling capacitor 204, sense transistor 205 and tunnelling capacitor 206 as shown in FIG. 2(a), but with the tunnelling capacitor of the combined device 212 flipped over so as to move the NWell 211 of the tunnelling capacitor away from the active region of the control transistor 501. The gate of control transistor 501 is connected to a control line 502 by means of which control transistor can be turned off so as to isolate the sense transistor from the bit line (or source line if the memory cell were reconfigured by swapping the positions of combined device 212 and control transistor 501).

The desirability of the embodiment of FIG. 5 in comparison to others can depend on the off-state leakage of the sense transistor in the low-VT (threshold voltage) state of the cell. For a single bit-cell the arrangement of FIG. 5 can be advantageous because the area penalty is small. For a differential bit-cell it may be preferable to select an embodiment that does not involve an additional control transistor. The access and tunnel areas of the mirror bit can be pushed into the area of the access transistor.

The introduction of the control transistor can therefore be used to control the leakage and disturbance characteristics of the memory cell and, advantageously, allows the combined sense transistor and tunnelling capacitor device 212 to be smaller and exhibit poorer leakage characteristics than would otherwise be acceptable for a desired level of data retention. Importantly, the introduction of a control transistor increases the memory cell size by only around 10% due to the need to maintain appropriate distances between the NWell regions of the coupling and tunnelling capacitors whilst maintaining the size of the NWell of the tunnelling capacitor at a manufacturable level. The control transistor itself is preferably of a standard I/O transistor size. It can be seen from FIG. 5(b) that the control transistor is significantly larger than the combined sense transistor and tunnelling capacitor device 212: this ensures that the on-resistance and variability of the control transistor does not compromise the read margin of the cell.

Figure 5B:
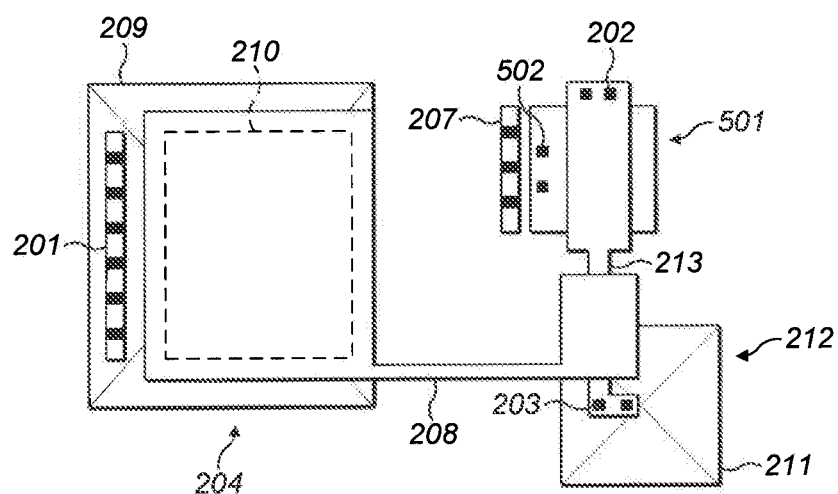
FIG. 5(b) is an exemplary cell layout of the non-volatile memory cell depicted in FIG. 5(a).

An exemplary layout of the preferred non-volatile memory cell of FIG. 5(a) on a p-type substrate is shown in FIG. 5(b). It can be seen from FIG. 5(b) that floating gate electrode 208 does not extend over control transistor 501. The gate electrode of the control transistor is connected to control line contacts 502. However, the control transistor could share a common dielectric layer 213 with combined device 212, as is shown in the example in FIG. 5(b). The control transistor 501 and combined device 212 could be connected together in series by a highly doped region of the semiconductor, or another interconnect layer.

Non-volatile memory cells configured in accordance with the present invention can be read, written to and erased by voltages on the bit, word, source and (in the case of cells configured in accordance with the preferred embodiment) control lines set out in Table 1. For memory cells fabricated in accordance with a standard 40 nm CMOS process, the programming voltage, Vprog is of the order of 7-9V and, due to the low current requirements, these voltages can be generated by on-chip charge pumps. The inhibit voltage, Vinh is approximately mid-way between 0V and Vprog to prevent unintentional write or erase of cells. Typically, the supply voltage of a CMOS chip is sufficient as an inhibit voltage.

It is advantageous if the doping density in the coupling capacitor and/or tunnelling capacitor NWells is increased at the bottom plates of the respective capacitors (i.e. in those parts of the NWells most remote from the floating gate electrode). This reduces the voltage dependence of their capacitance values and benefits the write/erase speed, or alternatively allows slightly lower voltages to be used. Such variation in doping density through an NWell can be achieved through the use of VT-adjust implant technology. This allows the use of relatively high NWell doping. Often the NWell implants are separate for core and I/O device in dual-oxide CMOS processes. For the purpose of the cell both well implants could be used on top of each other to increase the dopant density. This would typically involve no additional process steps, but a non-standard combination of the implants.

The applicant hereby discloses in isolation each individual feature described herein and any combination of two or more

|  | Selected cells | | | | Unselected (Inhibit) cells | | | |
| --- | --- | --- | --- | --- | --- | --- | --- | --- |
|  | WL | BL | SL | CG | WL | BL | SL | CG |
| Write | Vprog | OPEN | 0 V | OFF | 0 V | OPEN | Vinh | OFF |
| Erase | 0 V | OPEN | Vprog | OFF | (Vinh) | OPEN | 0 V | OFF |
| Read | Vreadwl | Vreadbl | 0 V | ON | 0 V | 0 V | 0 V | OFF |

In the table, the acronyms WL, BL, SL, CG refer to the word line, bit line, source line and control line, respectively.

The bit line is floating during all read and write operations to protect the sense circuitry from the high voltage used during write and erase. The voltages on the word and bit lines are preferably within the range of normal operating voltages that can be safely handled by standard I/O transistors of the process technology. During write operations, a tunnelling current flows through both the tunnelling capacitor and the gate of the sense transistor, whereas in erase only the tunnelling capacitor carries the Fowler-Nordheim tunnelling current. As a consequence, erase operations make take longer than write operations. It is therefore advantageous to apply erase operations in accordance with block erase algorithms, as is well known in the art. There is no need to apply an inhibit voltage during erase of blocks of memory cells in an array. However, the relative speed of erase and write operations also depends on the doping density of the NWell: during a write operation a high potential is applied to the NWell of the coupling capacitor causing a lower capacitance state as compared to erase. The particular erase algorithm chosen will therefore depend on the particular implementation of an array of memory cells configured in accordance with the present invention.

A further reduction in Poole-Frenkel charge loss can be achieved by forming a silicide-protect layer over the floating gate. Such silicide-protect layers are typically 30-60 nm thick layers of silicon-dioxide with better dielectric properties than the etch-stop layer and could be formed over the entire floating gate electrode or only over that part of the floating gate electrode overlapping the coupling capacitor. The use of the silicide-protect layer grows the cell area, since any contact to the cell have to be spaced away from it. The cell area penalty that results from adding such a layer is small because the combined sense transistor and tunnelling capacitor device reduces the number of contacts required in the cell, hence reducing the space required to separate the silicide-protect layer and the contacts. The silicide-protect layer is below the etch stop layer.

such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A non-volatile memory cell comprising:
a semiconductor substrate;
a coupling capacitor located at a first active region of the semiconductor substrate, the coupling capacitor including
a first plate formed by a floating gate electrode,
a second plate formed by a first Nwell region, and
a dielectric separating the first plate and the second plate;
a third active region forming a word-line contact to the first plate of the coupling capacitor, the third active region being separated from the first active region by shallow trench isolation; and
a merged tunneling capacitor and sense transistor located at a second active region of the semiconductor substrate, the sense transistor including a gate formed by the floating gate electrode and including a source region, and the tunneling capacitor including a first plate formed by the floating gate electrode, wherein the tunneling capacitor is adjacent to the source region of the sense transistor.

2. A non-volatile memory cell as claimed in claim 1, wherein sense transistor further includes a gate dielectric, wherein the tunneling capacitor further includes a dielectric, and wherein the gate dielectric of the sense transistor, the dielectric of the tunneling capacitor, and the dielectric of the coupling capacitor are formed of a same integrated circuit layer.

3. A non-volatile memory cell as claimed in claim 1, wherein the floating gate electrode extends over all of a perimeter of the first active region.

4. A non-volatile memory cell as claimed in claim 1, wherein the tunneling capacitor includes a second plate formed by a second Nwell region, and wherein the source region of the sense transistor is formed by the second Nwell region.

5. A non-volatile memory cell as claimed in claim 1, wherein the sense transistor further includes a lightly-doped drain region.

6. A non-volatile memory cell as claimed in claim 1, wherein a drain of the sense transistor is coupled to contacts for a bit line and the source of the sense transistor is coupled to contacts for a source line.

7. A non-volatile memory cell as claimed in claim 1, further comprising a control transistor at a fourth active region of the semiconductor substrate, wherein the control transistor is coupled between a drain of the sense transistor and a bit line, and wherein the gate of the control transistor is electrically isolated from the floating gate electrode.

8. A non-volatile memory cell as claimed in claim 7, wherein, through manipulation of the voltage at the gate of the control transistor, the control transistor is operable to isolate the sense transistor from the bit line.

9. A non-volatile memory cell as claimed in claim 1, wherein the floating gate electrode is an n-type doped conductor.

10. A non-volatile memory cell as claimed in claim 1, wherein the capacitance of the coupling capacitor is substantially larger than the total capacitance of the tunneling capacitor and the gate capacitance of the sense transistor.

11. A non-volatile memory cell as claimed in claim 1, wherein the floating gate electrode is polysilicon.

12. A non-volatile memory cell as claimed in claim 1, wherein the floating gate electrode is substantially covered by an etch-stop layer.

13. A non-volatile memory cell as claimed in claim 1, further comprising a protective layer between the floating gate electrode and an etch stop layer for inhibiting conduction between the floating gate electrode and the etch stop layer.

14. A non-volatile memory cell as claimed in claim 13, wherein the protective layer is a silicide-protect layer.

15. A non-volatile memory cell as claimed in claim 1, wherein a concentration of dopant in the first Nwell region remote from the dielectric is increased over a concentration of dopant in the first Nwell region near the dielectric.

16. A non-volatile memory cell comprising:
a semiconductor substrate;
a coupling capacitor located at a first active region of the semiconductor substrate, the coupling capacitor including
a first plate formed by a floating gate electrode,
a second plate formed by a first Nwell region, and
a dielectric separating the first plate and the second plate; and
a merged tunneling capacitor and sense transistor located at a second active region of the semiconductor substrate,
the tunneling capacitor including a first plate formed by the floating gate electrode and second plate formed by a second Nwell region, and
the sense transistor including a gate formed by the floating gate electrode and a source formed by the second Nwell region.

17. A non-volatile memory cell as claimed in claim 16, wherein a third active region forms a word-line contact to the first plate, and wherein the third active region is separated from the first active region by shallow trench isolation.

18. A non-volatile memory cell as claimed in claim 16, wherein the sense transistor further includes a lightly-doped drain region.

19. A non-volatile memory cell as claimed in claim 16, wherein a drain of the sense transistor is coupled to a bit line and the source of the sense transistor is coupled to a source line.

20. A non-volatile memory cell as claimed in claim 16, further comprising a control transistor at a fourth active region of the semiconductor substrate, wherein the control transistor is coupled between a drain of the sense transistor and a bit line, and wherein the gate of the control transistor is electrically isolated from the floating gate electrode.

21. A non-volatile memory cell as claimed in claim 16, wherein the floating gate electrode is an n-type doped conductor.

22. A non-volatile memory cell as claimed in claim 16, wherein a concentration of dopant in the first Nwell region remote from the dielectric is increased over a concentration of dopant in the first Nwell region near the dielectric.

* * * * *